United States Patent [19]

Patterson et al.

[11] Patent Number: 5,755,937
[45] Date of Patent: May 26, 1998

[54] APPARATUS FOR APPLYING LAYERS OF METAL ONTO A SURFACE

[76] Inventors: James A. Patterson, 2074 20th St., Sarasota, Fla. 34234; George H. Miley, 914 W. Armory Dr., Champaign, Ill. 61821; Michael J. Williams, 807 W. James Ct., Mahomet, Ill. 61853

[21] Appl. No.: 748,682

[22] Filed: Nov. 13, 1996

[51] Int. Cl.$^6$ .................................... C23C 14/34
[52] U.S. Cl. ................ 204/298.15; 204/298.04; 204/298.05; 204/298.23; 204/298.29
[58] Field of Search ............ 204/192.12, 298.04, 204/298.15, 298.05, 298.19, 298.23, 298.27, 298.28, 298.29

[56] References Cited

U.S. PATENT DOCUMENTS

| | | | |
|---|---|---|---|
| 3,892,651 | 7/1975 | Salisbury et al. | 204/298.15 X |
| 4,080,281 | 3/1978 | Endo | 204/298.15 X |
| 4,560,462 | 12/1985 | Radford et al. | 204/298.15 X |
| 5,470,388 | 11/1995 | Goedicke et al. | 204/298.23 X |

*Primary Examiner*—Nam Nguyen
*Attorney, Agent, or Firm*—Charles J. Prescott

[57] ABSTRACT

An apparatus and method for supporting and agitating a plurality of loose objects during a procedure known as sputter coating. A magnetron gun and the apparatus are positioned within a vacuum chamber. The magnetron or sputtering gun produces a metal ion fog or vapor within the chamber which freely penetrates through screen mesh surfaces of a suspended basket of the apparatus containing the objects to be sputter coated. A solenoid or other suitable device vibrates the basket, agitating, and repeatedly momentarily suspending and reorienting the objects to achieve a very uniform metal layer being applied atop the objects. By changing the magnetron target or by using multiple magnetron, thin layers of multiple metals or layers with metal mixtures are also achievable with this technique.

7 Claims, 1 Drawing Sheet

APPARATUS FOR APPLYING LAYERS OF METAL ONTO A SURFACE

BACKGROUND OF THE INVENTION

1. Scope of Invention

This invention relates generally to an apparatus for applying thin, uniform layers of metal onto a surface of an object, and more particularly to sputter coating of small objects such as loose beads and microspheres with very thin, uniform metallic layers.

2. Prior Art

Various techniques for depositing a thin, uniform layer of metal atop an object such as a small spherical bead are taught in prior art such as electroplating. Electroplating techniques require elaborate equipment and process control in order to obtain satisfactory results. In addition to heavy equipment expense, sophisticated voltage and current regulating devices and equipment repair detract from these electroplating techniques. Also, control of ultra-thin coatings and multiple coatings of the type desired here is generally not possible with electroplating which is typically used for thicker coatings.

In U.S. Pat. No. 2,915,406, Rhode et al. has taught palladium plating by chemical reduction. In U.S. Pat. No. 4,316,786, Yu et al. reviews several method of coating glass microspheres with material having a relatively high mass intensity known as "hi-Z" materials are described. Methods of electroplating, electroless plating, chemical vapor deposition and physical vapor deposition techniques such as sputtering are briefly described. Yu also describes further prior art by Gilbert in U.S. Pat. No. 3,397,126, an improved electroplating technique and in U.S. Pat. No. 3,577,324 by Patterson which provides an apparatus wherein vibrating screens in an electroplating cell impart vibrations to the plating solution to strip gaseous byproducts from the particles to prevent the deposition of non-uniform surface coatings. According to Yu, however, vibration of the solution alone or in concert with solution flow is insufficient to provide free and random motion and efficient gas scavaging of the particles.

Small beads or microspheres with radii in the range of 1.0 mm and with special multi-coatings of thin films of various metallic materials are a key component in devices such as a hydrogen heat energy producing cell for which I, Dr. James Patterson, am the inventor. System cells and methods for producing excess heat which utilize thin coated beads are described in U.S. Pat. Nos. 4,943,355, 5,036,031, 5,318,675, 5,372,688, and 5,494,559. To date, these beads have typically been produced using various electroless chemical plating techniques which have generally been capable of producing a reasonably uniform multi layers of controlled thickness. However, it has become evident that the degree of uniformity of the metallic layers significantly influences the level of heat energy output and the longevity of the microbeads as catalytic elements themselves. Moreover, as much as half of the beads plated by these techniques have cracked surfaces and are unusable.

The present invention takes advantage of sputter coating or physical vapor deposition techniques and an apparatus that improves upon this technique by overcoming a process limitation of physical access by the vaporized metal to all surfaces of the small objects to be plated. By this invention, significant improvement in layer uniformity and defect reduction are achieved. Also, the achievement of uniform ultra-thin multi-layer coatings or coatings comprised of a mixture of metals becomes possible with this new technique.

BRIEF SUMMARY OF THE INVENTION

This invention is directed to an apparatus and method for supporting and agitating a plurality of loose objects during a procedure known as sputter coating. A magnetron gun and the apparatus are positioned within a vacuum chamber. The magnetron or sputtering gun produces a metal ion fog within the chamber which freely penetrates through screen mesh surfaces of a suspended basket of the apparatus which contains the objects to be sputter coated. A solenoid or other suitable device vibrates the basket, agitating, momentarily suspending and reorienting the objects to achieve a very uniform metal layer being applied atop the objects.

It is therefore an object of this invention to provide improved thickness consistency and uniformity in metallic layers applied onto small objects.

It is yet another object of this invention to utilize techniques and equipment of sputter coating which typically achieve very uniform coating onto larger objects to small loose objects such as small diameter beads as utilized in the Patterson energy producing electrolytic cells.

It is still another object of this invention to provide very uniform multi-layered coatings atop batches of loose objects such as small beads to achieve not only uniform plating on each bead but consistency in smoothness, continuity and thickness over all beads in each batch and from batch to batch, as well as significantly lower defects due to surface cracking.

It is yet another object of this invention to apply uniform metallic coatings atop spherical or aspherical cores which are uniform in thickness and coverage and are also crack free and crack resistant.

It is still another object of this invention to significantly increase the percentage of usable metal coated beads which are uniform and crack free after metal deposition.

It is still another object of this invention to achieve uniform single or multi-layer ultra-thin coatings on the aforementioned beads.

It is still another object of this invention to achieve a uniform single or multi-layer coating comprised of a metal mixture in each layer.

In accordance with these and other objects which will become apparent hereinafter, the instant invention will now be described with reference to the accompanying drawings.

DETAILED DESCRIPTION OF THE INVENTION

Figure 1:
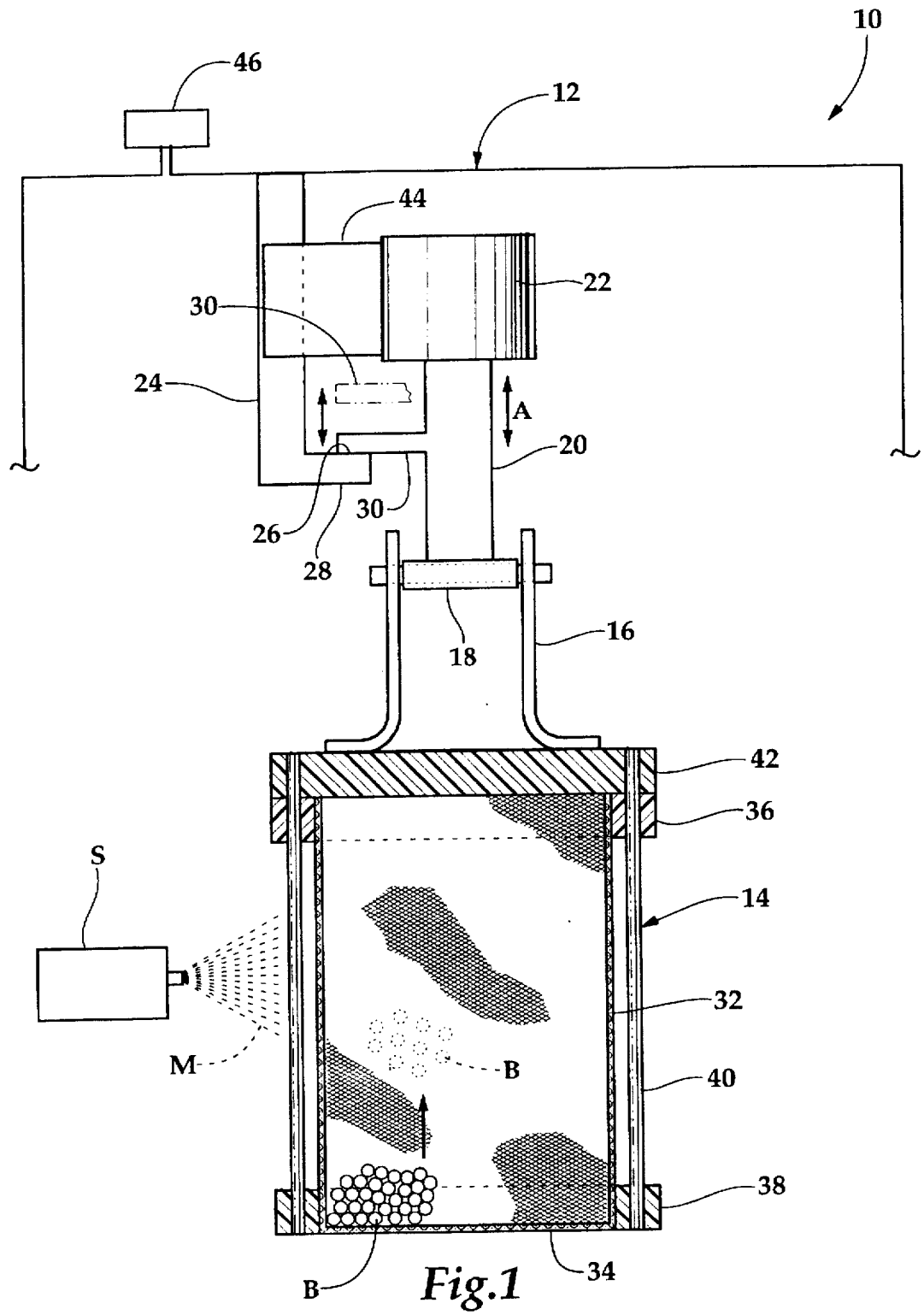
FIG. 1 is a side elevation schematic view in partial section of the invention with respect to a magnetron gun within a vacuum chamber.

The present invention utilizes the techniques of metal sputtering wherein a magnetron gun produces a metal ion vapor or "fog" preferably within a vacuum environment to physically deposit the metal ion vapor onto objects to be plated. Sputtering techniques are well known to produce more uniformity in the layer both with respect to smoothness and consistency of thickness. A quartz crystal witness plate technique is employed to determine and control the thickness of the applied coating. A key obstacle to this approach with respect to small loose objects such as microbeads in the range of 1 mm in diameter is to insure physical access of all surfaces of such small objects to the ion vapor produced by sputtering.

Referring now to FIG. 1, the present invention is shown generally at numeral 10 and includes a vacuum chamber 12 and a basket 14 for containing a plurality of small loose objects B to be coated. The basket 14 is suspended by a pivotal member 18 to an armature 20 of a conventional solenoid 22. Such a solenoid is available from Guardian Electric, Model 18C (20 v.). A bracket 44 interconnects the solenoid 22 to an upright support member 24 which is connected at its upper end to the vacuum chamber 12.

The solenoid 22 moves the armature 24 and attached basket 14, connected by pivotal connection 18 to brackets 16 vertically in the direction of arrow A. A mechanical stop arrangement formed by member 28 connected to support 24 and member 30 connected to armature 20 limits downward travel.

The basket 14 is formed of a cylindrical screen 32 of stainless steel having a mesh size of approximately 0.5 mm. This cylindrical screen 32 is held in position between rings 36 and 38 formed of LUCITE by rods 40. The upper end of this cylindrical screen 32 is closed by LUCITE plate 42 and at the lower end thereof by a screen disk 14 also formed of stainless steel mesh having a mesh size of 0.5 mm.

Positioned within the vacuum chamber 12 is a magnetron gun S. In conventional sputtering, the surface to be coated is placed near a metal target and the magnetron gun in a low pressure (milliTorr) argon or other inert gas fill. Direct electric current applied to the magnetron gun electrode ionizes the argon gas. The argon ions are bent by a magnetic field to bombard the metallic target of choice. The metal target by this bombardment is dislodged creating a metal ion fog or vapor which physically contacts and coats the intended surface in this environment.

However, the bulk of the coating applied in this conventional manner is deposited on the surface directly opposite the target and the gun. The basket 14, holds the loose objects B within the enclosure defined by the cylindrical screen member 32, the upper plate 42 and the bottom screen member 34. As solenoid 22 moves its armature vertically in the direction of arrow A, the basket 14 directly follows this movement resulting in the momentary suspending of these objects B in space such that the selected metal which has been turned into a metal ion fog by the magnetron gun S at M they fully penetrate through the cylindrical screen 32 and screen bottom plate 34 for physical uniform deposition on the suspended beads B.

The magnetron gun S utilized in experiments was made by Sputtered Films, Inc., the model being Research S-Gun Turbo Systems which was originally designed for the primary purpose of sputtering semiconductor material onto wafers for research. Vacuum chamber 12 is provided by a turbo molecular pump 46 with a liquid nitrogen cold trap. Power is supplied to the magnetron gun S by a power supply by Advanced Energy, Model MDX-1.5k which is capable of delivering one kilowatt of energy to the gun S. The inert gas fill for the gun is argon, flow regulated to maintain a pressure of 5 milliTorr within the guns during operation.

Metal targets of nickel and palladium used on the microbeads produced for the Patterson Energy Cells were obtained from Pure Tech, Inc. and consist of concentric rings of metal mounted in the gun S. A quartz crystal mounted close to the target receives sputter coating as well and changes the frequency of an RF nuclear oscillator in proportion to the coating thickness. This frequency change thus provides a very accurate indication, when properly calibrated, of the sputtering rate on a digital display unit.

The solenoid 22 is actuated at the rate of once per second at a duration of 0.3 seconds. This rate appears adequate to insure a uniform coating during runs of between ten and twenty minutes. Pulsed solenoid operation is provided by a Hewlett Packard pulse generator and a solid state relay. The solenoid 22 is operated at reduced voltage (50 vac) to insure its smooth operation.

After several experimental sputtering runs using the system 10 above described, sample beads were subjected to Auger Electron Spectroscopy for exact determination of metal film thickness. This provided a calibration factor for the quartz crystal indicator, a ratio of five thousand (5,000) angstroms of metal thickness deposited on the crystal to one thousand (1,000) angstroms of metal thickness deposited on the objects B (or a ratio of 5:1) was established for this particular setup.

Although it is preferred to provide a chamber 12 which, in combination with the above described pump 46 produces a vacuum atmosphere within the chamber 12, nonetheless the system above described, absent the vacuum atmosphere, will function reasonably well except for the contaminants within the air which may detract from deposit rate and uniformity, both features desirable in the preferred embodiment.

To apply multi-layer coatings, the metallic target in the magnetron gun is changed to the material desired for application of each layer. Alternately, to reduce processing time, a rotating target assembly or multiple guns may be employed. For deposition of metal mixtures in a layer, multiple guns and targets are employed and operated simultaneously. By individually adjusting the gun voltage and currents, the desired metal mixture can be obtained. A similar result can be obtained using a target consisting of the desired metal mixture, but such targets are frequently difficult to obtain or are simply not available.

While the instant invention has been shown and described herein in what are conceived to be the most practical and preferred embodiments, it is recognized that departures may be made therefrom within the scope of the invention, which is therefore not to be limited to the details disclosed herein, but is to be afforded the full scope of the claims so as to embrace any and all equivalent apparatus and articles.

What is claimed is:

1. An apparatus for use in sputter coating a uniform, metallic layer onto substantially entire surfaces of separate loose objects positioned in a metal ion vapor discharge from a magnetron gun comprising:

basket means defining a screen mesh enclosure for holding the objects therewithin;

said screen mesh enclosure formed of screen material having a mesh size smaller than the objects yet sufficiently large for free passage of the metal ion vapor discharge therethrough;

suspension means for supporting and agitating said basket means in a substantially vertical up and down movement whereby the objects therewithin are repeatedly momentarily suspended and made airborne enabling the metal ion vapor discharge which enters said screen mesh enclosure to uniformly deposit onto the entire surface of each object.

2. An apparatus as set forth in claim 1, wherein:

said screen mesh is formed of stainless steel screen material.

3. An apparatus as set forth in claim 1, further comprising:

means for maintaining a substantial vacuum atmosphere around said basket means and the magnetron gun.

4. An apparatus for supporting and agitating a plurality of loose, separate objects within a chamber while a uniform metallic layer of metal is being deposited atop each of the objects by sputter coating from a magnetron gun comprising:

- a basket having a screen mesh outer wall which defines an enclosure for containing and providing ample space for agitated movement of the plurality of objects;
- means for suspending and substantially vertically agitating said basket up and down and the objects placed within said basket whereby the objects are repeatedly made airborne within said basket;
- said screen mesh having a mesh size which allows free transfer of a metal ion vapor discharge into said enclosure for uniform deposit atop the entire surface of each of the plurality of objects.

5. An apparatus as set forth in claim 4, wherein:

said screen mesh is formed of stainless steel screen material.

6. An apparatus as set forth in claim 4, further comprising:

means for maintaining a substantial vacuum atmosphere around said basket means and the magnetron gun.

7. A method of applying a uniform, metal layer atop each of a plurality of loose, separate objects comprising the steps of:

A. placing the objects within a screen mesh basket and suspending said basket within a vacuum chamber;

B. establishing a substantial vacuum condition within said chamber;

C. agitating said basket substantially vertically up and down sufficiently to repeatedly cause each of the objects to become momentarily airborne within said basket;

D. directing a metal ion beam at said basket during step C, the metal ion beam contacting each of the objects to form the metal layer, the metal ion beam being produced by an ion vapor source positioned within said chamber until the metal layer is at a desired thickness.

\* \* \* \* \*